United States Patent
Alley et al.

(10) Patent No.: US 9,856,137 B2
(45) Date of Patent: Jan. 2, 2018

(54) BONDED WAFER STRUCTURES

(75) Inventors: Rodney L. Alley, Albany, OR (US); Donald J. Milligan, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 14/112,138

(22) PCT Filed: May 9, 2011

(86) PCT No.: PCT/US2011/035697
§ 371 (c)(1),
(2), (4) Date: Oct. 16, 2013

(87) PCT Pub. No.: WO2012/154165
PCT Pub. Date: Nov. 15, 2012

(65) Prior Publication Data
US 2014/0042596 A1 Feb. 13, 2014

(51) Int. Cl.
*B81B 7/00* (2006.01)
*H01L 21/20* (2006.01)
*H01L 21/50* (2006.01)
*B81C 1/00* (2006.01)

(52) U.S. Cl.
CPC ........ *B81B 7/0077* (2013.01); *B81C 1/00269* (2013.01); *H01L 21/2007* (2013.01); *H01L 21/50* (2013.01); *B81B 2207/092* (2013.01)

(58) Field of Classification Search
CPC . H01L 25/043; H01L 25/0657; H01L 25/074; B81B 7/0032–7/0077; B81C 1/00261–1/00333
See application file for complete search history.

(56) References Cited

U.S. PATENT DOCUMENTS

| | | | |
|---|---|---|---|
| 6,277,666 B1 | 8/2001 | Hays et al. | |
| 6,519,075 B2 | 2/2003 | Carr et al. | |
| 6,639,289 B1 | 10/2003 | Hays et al. | |
| 7,166,493 B2 | 1/2007 | Dentry et al. | |
| 2003/0174383 A1 | 9/2003 | Bolle et al. | |
| 2004/0087043 A1* | 5/2004 | Lee et al. | 438/6 |
| 2005/0170614 A1 | 8/2005 | Patel et al. | |
| 2007/0097278 A1* | 5/2007 | Rho et al. | 349/12 |

(Continued)

OTHER PUBLICATIONS

Park, K.K. et al. Fabricating Capacitive Micromachined Ultrasonic Transducers with Direct Wafer-bonding and Locos Technology ; < http://www-kyg.stanford.edu/khuriyakub/opencms/Downloads/08_Park_01.pdf > On pp. 339-342 ; Jan. 13-17, 2008.

*Primary Examiner* — Bryan Junge
(74) *Attorney, Agent, or Firm* — Brooks, Cameron & Huebsch, PLLC (57) ABSTRACT

The present disclosure includes bonded wafer structures and methods of forming bonded wafer structures. One example of a forming a bonded wafer structure includes providing a first wafer (202, 302) and a second wafer (204, 304) to be bonded together via a bonding process that has a predetermined wafer gap (216, 316) associated therewith, and forming a mesa (215, 315, 415) on the first wafer (202, 302) prior to bonding the first wafer (202, 302) and the second wafer (204, 304) together, wherein a height (220, 320, 420) of the mesa (215, 315, 415) is determined based on a target element gap (217, 317) associated with the bonded wafer structure.

10 Claims, 4 Drawing Sheets

(56) References Cited

U.S. PATENT DOCUMENTS

| | | |
|---|---|---|
| 2009/0019932 A1 | 1/2009 | Carderelli |
| 2009/0180043 A1* | 7/2009 | Rho et al. ...................... 349/12 |
| 2010/0084752 A1 | 4/2010 | Horning et al. |
| 2010/0096713 A1 | 4/2010 | Jung |
| 2010/0147075 A1 | 6/2010 | Magendanz et al. |
| 2010/0242603 A1 | 9/2010 | Miller et al. |
| 2011/0049652 A1 | 3/2011 | Wu et al. |

* cited by examiner

BONDED WAFER STRUCTURES

FIELD OF THE INVENTION

The disclosure generally concerns microelectromechanical structures (MEMS). More particularly, the disclosure concerns gap control in bonded wafer MEMS.

BACKGROUND

Microelectromechanical structures (MEMS) include sensors and actuators that can be fabricated using semiconductor processing techniques. Various MEMS devices (e.g., sensors and actuators) include electrostatic, magnetic, and/or other elements (e.g., electrodes) used to effect and/or detect changes in position or separation between surfaces. MEMS sensors and actuators can be formed, for instance, by bonding wafers together. Characteristics of the sensors and actuators, such as sensitivity, can depend on the distance between electrodes on adjacent wafer surfaces.

DETAILED DESCRIPTION

Bonded wafer structures and methods of forming bonded wafer structures are described herein. One example of forming a bonded wafer structure includes providing a first wafer and a second wafer to be bonded together via a bonding process that has a predetermined wafer gap associated therewith, and forming a mesa on the first wafer prior to bonding the first wafer and the second wafer together, wherein a height of the mesa is determined based on a target element gap associated with the bonded wafer structure.

Embodiments of the present disclosure can provide various benefits such as increasing sensitivity and/or force of actuation associated with MEMS sensors and/or actuators. As an example, embodiments can provide the ability to accurately and precisely set the gap (e.g., the element gap) between interacting electrode elements (e.g., sensing and/or actuating elements) on different wafer surfaces independently from the bonded wafer gap associated with bonding features, such as bond ring and standoff features, used to bond wafers together. Embodiments can also provide accurate and precise control of the element gap while providing for electrical continuity between the sensing and/or actuating elements and other conductive elements of the bonded wafer structure without increased processing complexity associated with previous methods. Since the sensing and actuating gap is set independently of the bond-process-determined wafer gap by adjusting the thickness of the dielectric mesa layer, the sensing and actuating gap can be flexibly and quickly adjusted to match different device performance requirements without other design, process, or structural changes.

As used in this disclosure, the terms "wafer" and "substrate" are used interchangeably and are to be understood as including, but not limited to, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. Also, as used herein, "a number of" something can refer to one or more of such things.

Figure 1:
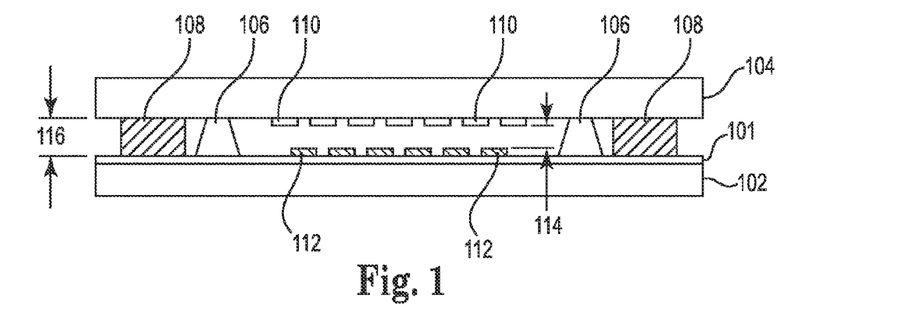
FIG. 1 illustrates a cross-sectional view of a bonded wafer structure.

FIG. 1 illustrates a cross-sectional view of a bonded wafer structure. The bonded wafer structure illustrated in FIG. 1 includes a first wafer 102 and a second wafer 104 bonded together via a bonding process having a predetermined wafer gap 116 associated therewith. For instance, in the example illustrated in FIG. 1, the bonding process includes the use of a bond ring 108 and standoffs 106 which create the predefined wafer gap 116 between the inner surfaces of the respective wafers 102 and 104. The wafer gap 116 can be on the order of about 2 to 20 microns and can depend on factors such as the particular materials (e.g., solder) used to form the bond ring 108 and or interconnects (not shown), for instance.

In the example illustrated in FIG. 1, the bonded wafer structure is a MEMS device including a number of sensing and/or actuating elements 112 (e.g., electrodes) formed on a dielectric material 101 formed on the wafer 102, and a number of sensing and/or actuating elements 110 formed on the wafer 104. That is, the bonded wafer structure is a MEMS sensor or actuator including arrays of elements 112 and 110 formed on the respective wafers 102 and 104. The elements 112 and 110 can be electrostatic or magnetic elements, among other types of sensing and/or actuating elements used to effect or detect changes in position or separation between surfaces (e.g., the surfaces of wafers 102 and 104). As such, the sensitivity (e.g., output strength) of the structure depends on the element gap 114 between the sensing and/or actuating elements 112 and 110.

In bonded wafer structures such as that illustrated in FIG. 1, the element gap 114 is dependent on, and limited by, the predetermined wafer gap 116. For instance, it can be difficult to modify the element gap 114 without modifying the wafer bonding process (e.g., by modifying the features 106/108 and/or the materials used to form them) itself. As such, providing for various different element gaps 114 can include having to re-engineer and recharacterize the wafer bonding process for each different target value for the element gap 114, which is inflexible, process intensive, and inconvenient. Another option is to accept the particular element gap 114 that results from the predetermined wafer gap 116, which can have drawbacks such as a reduced range of possible element gaps 114 and an inability to achieve narrower element gaps 114, for example. Other approaches may include forming sensing and/or actuating elements 112 and/or 110 on a dielectric stack to modify the element gap 114. However, the dielectric stacks have abrupt step-height changes, which result in having to form vias through the dielectric stack material(s) in order to provide electrical contact between separately processes metal layers (e.g., a metal layer on an upper surface of the dielectric stack and a metal layer below a lower surface of the stack). As such, this approach can also add significant additional processing steps to forming the bonded wafer structure and can be inflexible, for instance.

Figure 2A:
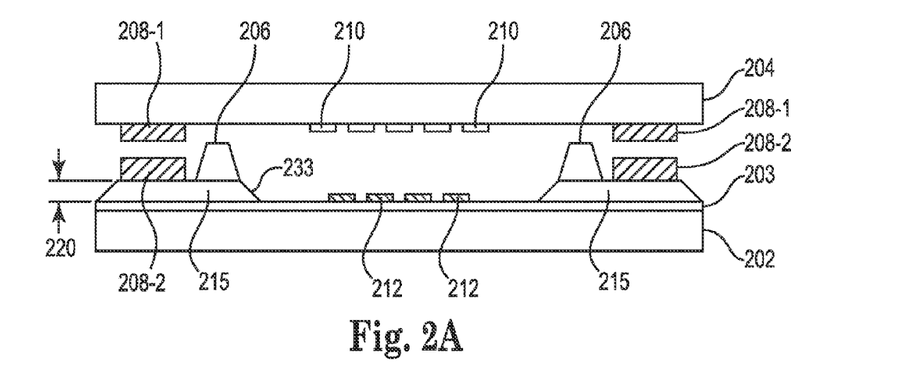
FIGS. 2A and 2B illustrate cross-sectional views of a bonded wafer structure in accordance with an embodiment of the present disclosure.
Figure 2B:
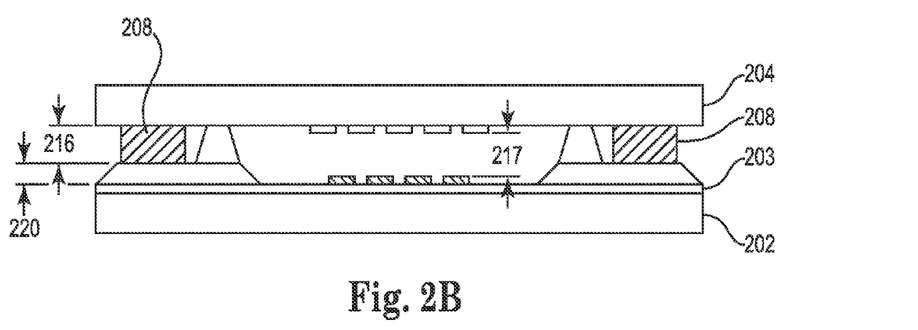

FIGS. 2A and 2B illustrate cross-sectional views of a bonded wafer structure in accordance with an embodiment of the present disclosure. FIG. 2A illustrates a first wafer 202 and a second wafer 204 prior to being bonded together via a wafer bonding process, and FIG. 2B illustrates the wafers 202 and 204 subsequent to being bonded together. The bonding process used to bond the wafers 202 and 204 has a predetermined wafer gap 216 associated therewith. As an example, the wafer bonding features 208-1 on wafer 204 and the wafer bonding features 208-2 on wafer 202 can be a bond ring material and corresponding bond pad material, and the wafer bonding features 206 can be standoffs. As such, and as illustrated in FIG. 2B, the standoffs 206 and features 208-1 and 208-2 can form a bond ring 208, which results in bonded wafer gap 216.

In the embodiment illustrated in FIG. 2B, the bonded wafer structure is a MEMS device including a number of sensing and/or actuating elements 212 (e.g., electrodes) formed on the wafer 202 and a number of sensing and/or actuating elements 210 formed on the wafer 204. That is, the bonded wafer structure is a MEMS sensor or actuator including arrays of elements 212 and 210 formed on the respective wafers 202 and 204. As an example, the MEMS device illustrated in FIG. 2B can be a capacitive sensor and can be used to sense various physical quantities such as acceleration, position, proximity, flow, and/or pressure, among other physical quantities. However, embodiments are not limited to a particular type of MEMS sensing and/or actuating device.

In one or more embodiments, and as illustrated in FIGS. 2A and 2B, one or more mesas (e.g., 215) can be formed on at least one of the wafers (e.g., wafers 202 and 204) prior to bonding the wafers together. The mesa(s) can be formed of a dielectric material and the height (e.g., 220) of the mesa(s) can be determined based on a target element gap (e.g., 217) associated with the bonded wafer structure. That is, the height 220 of the mesa 215 can be controlled to provide a particular element gap (e.g., 217) between the electrodes 212 and 210. As such, in various embodiments, the mesas 220 can be used to provide an element gap 217 that is different than the bonded wafer gap 216. In various embodiments, and in the example illustrated in FIGS. 2A and 2B, the mesas 215 have sloped sidewalls 233.

As described further below, the height 220 of the mesa 215 can be less than about 2 microns and can be controlled to an accuracy of within less than about 100 nanometers; however, embodiments are not limited to a particular height 220 or to a particular level of accuracy and/or precision. The mesas 215 can be formed of a dielectric material such as silicon dioxide and/or TEOS (tetraethyl orthosilicate), among various other suitable dielectric materials.

In the embodiment illustrated in FIGS. 2A and 2B, a dielectric material 203 is formed on the wafer 202 and the mesas 215 are formed on a different dielectric material. In various embodiments, and as described further below in connection with FIGS. 4A-4C, the dielectric material 203 can be used as an etch stop material associated with formation of the mesas 215. As an example, the dielectric material 203 can be a silicon carbide material. However, the particular dielectric material 203 used as the etch stop can depend on factors such as the dielectric material of the mesa 215 and/or the particular type of etch performed, among various other factors.

In the embodiment illustrated in FIGS. 2A and 2B, increasing the height 220 of the mesas 215 results in an increased target element gap 217. For instance, the standoff bonding features 206 and bond ring features 208-2 are formed on an upper surface of the mesas 215. Since the bonding features 208 and 206 have a predetermined wafer gap 216 associated therewith, increasing the height 220 of the mesas 215 will result in an increased element gap 217. As such, the element gap 217 can be set separately from the wafer gap 216. In this example, the element gap 217 is larger than it would be if determined solely by the bonding process associated with the predetermined bonding wafer gap 216. As described further below in connection with FIGS. 3A and 3B, embodiments of the present disclosure can also provide mesas that allow providing a narrower element gap than that provided solely by the bonding process associated with the bonded wafer gap 216.

Figure 3A:
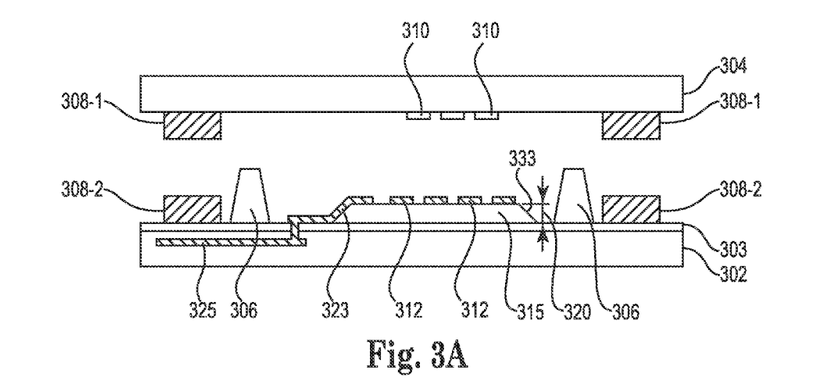
FIGS. 3A and 3B illustrate cross-sectional views of a bonded wafer structure in accordance with an embodiment of the present disclosure.
Figure 3B:
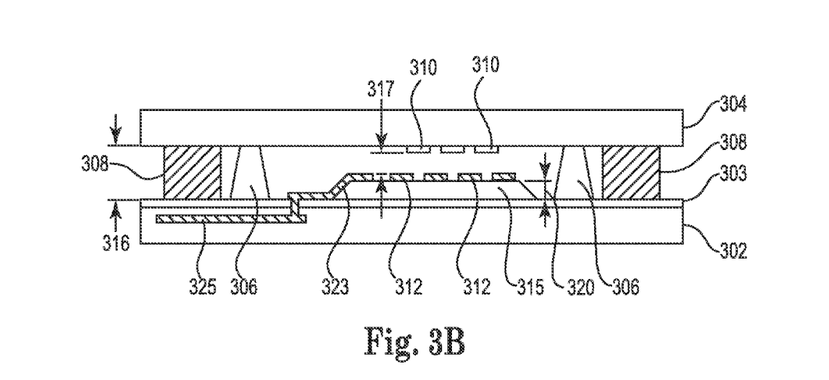

FIGS. 3A and 3B illustrate cross-sectional views of a bonded wafer structure in accordance with an embodiment of the present disclosure. FIG. 3A illustrates a first wafer 302 and a second wafer 304 prior to being bonded together via a wafer bonding process and FIG. 3B illustrates the wafers 302 and 304 subsequent to being bonded together. The bonding process used to bond the wafers 302 and 304 has a predetermined wafer gap 316 associated therewith. As an example, the wafer bonding features 308-1 on wafer 304 and the wafer bonding features 308-2 on wafer 302 can be a bond ring material and corresponding bond pad material, and the wafer bonding features 306 can be standoffs. As such, the standoffs 306 and features 308-1 and 308-2 can form a bond ring 308, which results in bonded wafer gap 316.

In the embodiment illustrated in FIG. 33, the bonded wafer structure is a MEMS device including a number of electrode elements 312 formed on the wafer 302 and a number of electrode elements 310 formed on the wafer 304.

In the embodiment illustrated in FIGS. 3A and 3B, a mesa 315 having sloped sidewalls 333 is formed on the wafer 302 prior to bonding the wafers together. The mesa 315 can be formed of a dielectric material and the height 320 of the mesa can be determined based on a target element gap 317 associated with the bonded wafer structure. For instance, the height 320 of the mesa 315 can be controlled to provide a particular element gap 317 between the electrodes 312 and 310. As such, in various embodiments, the mesas 320 can be used to provide an element gap 317 that is different than the bonded wafer gap 316.

In the embodiment illustrated in FIGS. 3A and 3B, a dielectric material 303 is formed on the wafer 302. The mesa 315 is formed on the dielectric material 303 and can be formed of a dielectric material different from dielectric material 303. In various embodiments, the dielectric material 303 can be used as an etch stop material associated with formation of the mesa 315.

In the embodiment illustrated in FIGS. 3A and 3B, increasing the height 320 of the mesa 315 results in a decreased target element gap 317. For instance, in this embodiment, the sensing and/or actuating elements 312 are formed on an upper surface of the mesa 315. Since the bonding features 308 and 306 have a predetermined wafer gap 316 associated therewith, increasing the height 320 of the mesa 315 will result in a decreased element gap 317. As such, the element gap 317 can be set separately from the wafer gap 316. In this example, the element gap 317 is narrower (e.g., less) than it would be if determined solely by the bonding process associated with the predetermined bonding wafer gap 316. In various embodiments, narrowing the element gap 317 can provide benefits such as increasing a sensitivity associated with the bonded wafer structure, among other benefits. As described further in connection with FIGS. 4A-4C, formation of the mesa 315 can provide more precise control of the target element gap 317 as compared to prior approaches.

In various embodiments, the sloped sidewalls (e.g., 333) of the mesa(s) (e.g., 315) can provide for electrical continuity between metal layers having one or more dielectric layers therebetween without having to form vies through the intervening dielectric layers. Forming through vies in the intervening dielectric layers can increase the processing complexity associated with providing electrical continuity between conductive elements at different levels, among other drawbacks. In the embodiment illustrated in FIGS. 3A and 33, a conductive material 323 is formed on a sloped sidewall 333 of the mesa 315. The conductive material 323 provides a conductive connection between the array of electrodes 312 formed on the upper surface of the mesa 315 and a conductive element 325 located below a bottom surface of the mesa 315. The conductive element can be a wirebond pad or other conductive element associated with the bonded wafer structure. As illustrated, the sloped sidewall 333 of the mesa 315 provides for electrical continuity between the electrodes 312 and the element 325 without the use of a via formed through the dielectric material of mesa 315. In instances in which the mesa 315 does not have sloped sidewalls 333, forming the conductive material 323 can lead to discontinuities in the conductive material 323, as it can be difficult to form the conductive material on a vertical sidewall, for instance.

Although not illustrated, in one or more embodiments, a mesa (e.g., 215/315) can be formed on a surface of both the first wafer (e.g., 202/302) and second wafer (e.g., 204/304). Also, one or both wafers of a bonded wafer structure in accordance with embodiments of the present disclosure can include one or more wafer bonding features such as a standoff (e.g., 206/306) formed on a first mesa as well as a number of sensing and/or actuating elements formed on a second mesa. For instance, the mesa features 215 of the bonded wafer structure shown in FIGS. 2A and 2B can be combined with the mesa features 315 of the bonded wafer structure shown in FIGS. 3A and 3B. Furthermore, multiple mesas can be formed to different heights on one or both wafers, which can be useful for providing multiple different target element gaps between different types of sensing and/or actuating elements, for instance.

Figure 4A:
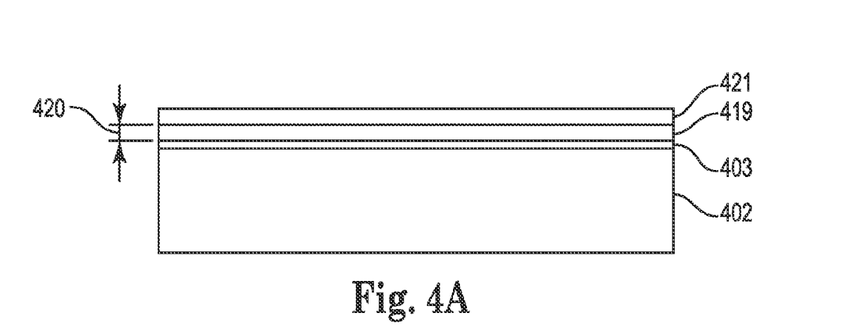
FIGS. 4A-4C illustrate processing steps associated with forming a portion of a wafer structure in accordance with an embodiment of the present disclosure.
Figure 4B:
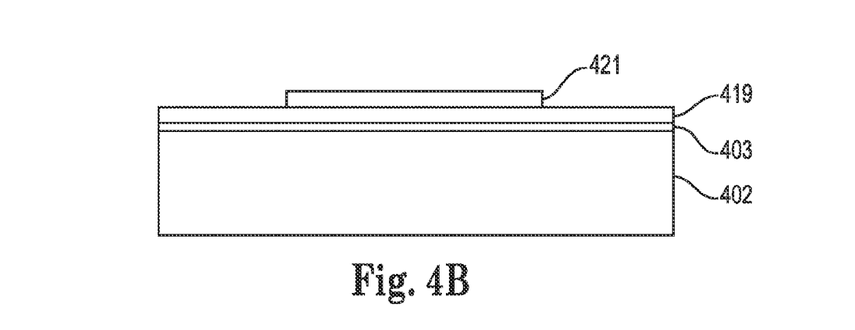
Figure 4C:
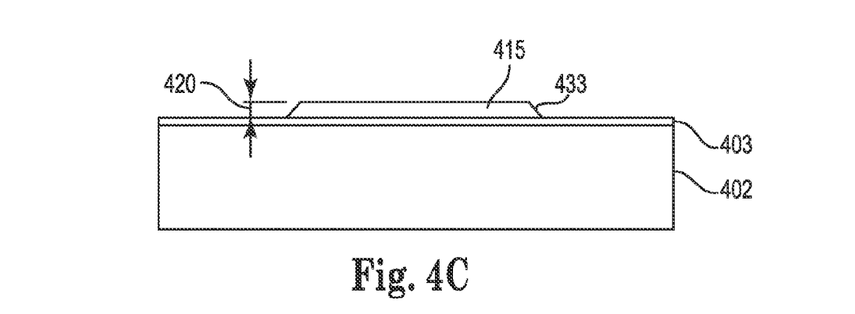

FIGS. 4A-4C illustrate processing steps associated with forming a portion of a wafer structure in accordance with an embodiment of the present disclosure. As an example, the wafer structure shown in FIGS. 4A-4C can be a wafer structure such as those illustrated in FIGS. 2A, 2B, 3A, and 3B. For instance, the process illustrated in FIGS. 4A-4C can be used to form one or more mesas described herein.

The structure illustrated in FIGS. 4A-4C includes a base wafer 402, which can include a silicon substrate or other doped or undoped base semiconductor substrate. A first dielectric material 403 is formed on the wafer 402. In various embodiments, the first dielectric material 403 serves as an etch stop material associated with forming a mesa (e.g., 415). Although not illustrated, a number of dielectric, conductive, and/or semiconductive materials may be formed between substrate 402 and dielectric 403. The first dielectric material 403 can be a dielectric material such as a silicon carbide (SiCx) material and can have a thickness of about 100 nanometers; however, embodiments are not limited to a particular material 403 or to a particular thickness.

A second dielectric material 419 is formed on the first dielectric material 403. Since the first dielectric material 403 is an etch stop, the second dielectric 419 is a different dielectric material than material 403. The second dielectric material 419 can be a silicon oxide material such as TEOS (tetraethyl orthosilicate) or silicon dioxide, among various other suitable dielectric materials. The second dielectric material can be formed via a chemical vapor deposition (CVD), physical vapor deposition (PVD), or atomic layer deposition (ALD), among various other semiconductor processing techniques. The thickness 420 of the second dielectric material 419 is the same as the height 420 of the mesa 415, which is determined based on the target element gap (e.g., 217/317) associated with a bonded wafer structure in accordance with embodiments described herein. In various embodiments, the dielectric material 419 is formed to a thickness 420 of less than about 2 microns. In one or more embodiments, the thickness 420 can be between about 0.5 microns and 1.5 microns. However, the thickness 420 of the second dielectric material 419 can be greater than 2 microns, in some embodiments.

As illustrated in FIG. 4A, a photoresist material 421 is formed on the second dielectric material 419. Although not illustrated, a mask can be formed on the photoresist 421. The photoresist 421 is then exposed (e.g., via a suitable light source) and the undesired portions thereof are removed. FIG. 4B illustrates the remaining photoresist material 421 located on the second dielectric material 419 (e.g., over the portion of the dielectric 419 that is to become the mesa 415). As such, the remaining material 421 serves as a mask associated with forming the mesa 415.

An etch process is performed on the structure illustrated in FIG. 43 in order to form the mesa 415 illustrated in FIG. 4C. In various embodiments, the etch can be a wet etch such as a buffered oxide etch (BOE) used to remove the portions of the second dielectric material 419 other than the material of the mesa 415. The wet etch undercuts the masking resist 421 shown in FIG. 4B resulting in the sloped sidewalls 433 of the mesa 415. As described above, the sloped sidewalls 433 of mesa 415 can be useful for providing conductive transitions between elements on a surface of the mesa 415 and conductive elements located below the mesa 415 without forming vias through the mesa 415. Since the etch stops on the first dielectric material 403, a precise height 420 of the mesa 415 is obtained (e.g., the precision of the mesa height 420 is determined by the precision level associated with the formation of the second dielectric material 419). The precision associated with forming the mesa 415 via the method illustrated in FIGS. 4A-4C can be higher than, for example, a method in which the height 420 of the mesa 415 is based on a timed etch.

Figure 5:
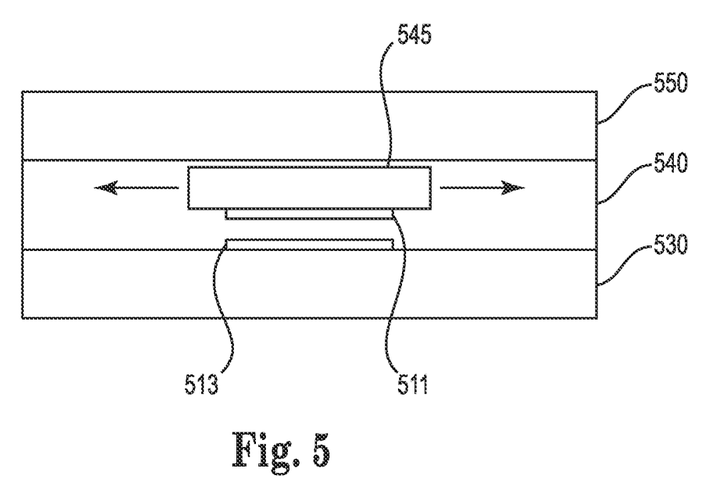
FIG. 5 is a schematic illustrating a MEMS sensor including a bonded wafer structure according to an embodiment of the present disclosure.

FIG. 5 is a schematic illustrating a MEMS sensor 500 including a bonded wafer structure according to an embodiment of the present disclosure. As an example, the MEMS sensor illustrated in FIG. 5 can be a capacitive sensor 500 used to detect various physical quantities including position, proximity, acceleration, flow, and/or pressure, among various other physical quantities. In this example, the sensor 500 includes three physical structures (e.g., wafers). The structures include an electronics wafer 530, a proof mass wafer 540, and a cap wafer 550.

The electronics wafer 530 can include CMOS electronics and may be electrically coupled to various electrical components in the proof mass wafer 540 and/or cap wafer 550. The electronics wafer 530 can also provide input/output ports (not shown) for coupling to electronic components external to sensor 500.

Although not shown in FIG. 5, the proof mass wafer 540 can include a support structure and a number of suspension elements mechanically coupled to a proof mass 545. As such, the proof mass 545 can be suspended above the electronics wafer 530 and can move laterally with respect to the electronics wafer 530.

A first electrode array 511 is formed on the proof mass 545. The first electrode array 511 can include a number of sensing and/or actuating elements such as elements 212 illustrated in FIGS. 2A and 2B or elements such as elements 312 illustrated in FIGS. 3A and 3B, for example. A second electrode array 513 is formed on the electronics wafer 530. The second electrode array can include a number of sensing and/or actuating elements such as elements 210 illustrated in FIGS. 2A and 2B or elements such as elements 310 illustrated in FIGS. 3A and 3B, for example. As illustrated in FIG. 5, the sensor 500 is configured such that the first and second electrode array 511 and 513 face each other and are separated by a particular element gap, such as element gap 217 illustrated in FIG. 2B or element gap 317 illustrated in FIG. 3B.

In operation, sensor 500 can be affixed to various structures such as a vehicle, a mobile device, a computer, or other structure that may experience a change that one desires to quantify (e.g., a change in acceleration). The movement of the electrodes of arrays 511 and 513 with respect to each other results in variances in cross capacitance between the arrays, for instance. These capacitance variances can be sensed by electronics within wafer 530 and/or external to the sensor 500, for example. Such circuitry can provide output signals proportional to the acceleration change experienced by the sensor 500.

In some embodiments, a closed loop circuit may be employed to maintain the proof mass 545 at a predetermined position during acceleration. Such circuitry can apply actuation signals to cause the proof mass 545 to remain at the predetermined position based on position feedback from the arrays 511 and 513.

The sensor 500 can include a bonded wafer structure formed in accordance with embodiments described herein. As such, an element gap associated with the electrode array 511 and the electrode array 513 can be more easily modified and/or more precisely determined as compared to previous MEMS sensors. Embodiments of the present disclosure can provide various benefits such as increasing sensitivity and/or force of actuation associated with MEMS sensors and/or actuators, among other benefits.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one.

Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A method of forming a bonded wafer structure, the method comprising:
   providing a first wafer and a second wafer to be bonded together via a bonding process that has a predetermined wafer gap associated therewith;
   forming a first bonding feature on the first wafer and a second bonding feature on the second wafer, the second wafer bonded to the first wafer at an interface between the first bonding feature and the second bonding feature; and
   forming a mesa on the first wafer prior to bonding the first wafer and the second wafer together, wherein a height of the mesa is determined based on a target element gap between a plurality of first elements on the mesa and a plurality of second elements on a bottom side of the second wafer.

2. The method of claim 1, including forming a number of electrode elements on the mesa.

3. The method of claim 1, including forming a conductive connection between at least one of the number of electrode elements and a conductive element located below a bottom surface of the mesa without using a via formed through the mesa.

4. The method of claim 1, including forming an electrode array on the mesa.

5. The method of claim 1, wherein forming the mesa includes:
   forming an etch stop material on a surface of the first wafer;
   forming a dielectric material on the etch stop material, a thickness of the dielectric material corresponding to the height of the dielectric mesa;
   performing a mask and wet etch process to remove portions of the dielectric material other than dielectric material of the mesa; and
   wherein the mesa includes sloped sidewalls.

6. A bonded wafer structure comprising:
   a first wafer structure;
   a second wafer structure including a plurality of electrode elements formed thereon;
   a number of bonding features formed on the first wafer structure and the second wafer structure and providing a predetermined wafer gap associated with the bonded wafer structure; and
   a mesa formed on the first wafer structure, a height of the mesa determined based on a target element gap between a plurality of electrode elements formed on the mesa and the plurality of electrode elements formed on the second wafer structure, wherein the element gap is different than the predetermined wafer gap,
   wherein the first and the second wafer structures are bonded together via the bonding features, and
   wherein the plurality of electrode elements formed on the second wafer structure face the plurality of electrode elements formed on the mesa.

7. The bonded wafer structure of claim 6, wherein the number of bonding features include a number of bond rings and a number of standoffs.

8. The bonded wafer structure of claim 6, wherein at least one of the number of electrode elements is formed on the mesa such that the particular element gap is less than the predetermined wafer gap.

9. The bonded wafer structure of claim 6, wherein at least one of the first and the second wafer structure includes:
   a first dielectric material on which the mesa and at least one of the number of bonding features is formed;
   wherein the mesa includes a second dielectric material different from the first dielectric material; and
   wherein the first dielectric material is an etch stop material associated with forming the mesa.

10. The bonded wafer structure of claim 6, wherein the height of the mesa is less than two microns.

\* \* \* \* \*